United States Patent
Kato et al.

(10) Patent No.: US 11,183,393 B2
(45) Date of Patent: Nov. 23, 2021

(54) ATOMIC LAYER ETCHING USING ACID HALIDE

(71) Applicant: KANTO DENKA KOGYO CO., LTD., Tokyo (JP)

(72) Inventors: Korehito Kato, Gunma (JP); Katsuya Fukae, Gunma (JP); Yoshinao Takahashi, Tokyo (JP)

(73) Assignee: KANTO DENKA KOGYO CO., LTD., Tokyo (JP)

(*) Notice: Subject to any disclaimer, the term of this patent is extended or adjusted under 35 U.S.C. 154(b) by 413 days.

(21) Appl. No.: 16/336,535

(22) PCT Filed: Sep. 14, 2018

(86) PCT No.: PCT/JP2018/034213
§ 371 (c)(1),
(2) Date: Mar. 26, 2019

(87) PCT Pub. No.: WO2019/054490
PCT Pub. Date: Mar. 21, 2019

(65) Prior Publication Data
US 2021/0287911 A1    Sep. 16, 2021

(30) Foreign Application Priority Data
Sep. 15, 2017   (JP) .............................. JP2017-178037

(51) Int. Cl.
*H01L 21/311*   (2006.01)
(52) U.S. Cl.
CPC .............................. *H01L 21/31116* (2013.01)
(58) Field of Classification Search
None
See application file for complete search history.

(56) References Cited

U.S. PATENT DOCUMENTS

| | | |
|---|---|---|
| 2012/0231630 A1 | 9/2012 | Takada et al. |
| 2015/0118858 A1 | 4/2015 | Takaba |
| (Continued) | | |

FOREIGN PATENT DOCUMENTS

| | | |
|---|---|---|
| EP | 2508500 A1 | 10/2012 |
| JP | 2011119310 A | 6/2011 |
| (Continued) | | |

OTHER PUBLICATIONS

Extended European Search Report mailed in corresponding European Aplication No. EP18855137 dated Apr. 6, 2020.
(Continued)

*Primary Examiner* — Roberts P Culbert
(74) *Attorney, Agent, or Firm* — Browdy and Neimark, PLLC

(57) ABSTRACT

A method of atomic layer etching a silicon oxide film or a silicon nitride film is provided. Atomic layer etching (ALE) is performed by repeating three steps of (1) hydrogenation step of hydrogenating a surface by irradiating a silicon oxide film or a silicon nitride film with a plasma containing H, (2) acid halide adsorption step of causing chemisorption of an acid halide represented by a formula of Rf—COX (Rf is H, F, a substituent consisting of C and F or consisting of C, H, and F, or —COX; each X is independently any halogen atom of F, Cl, Br and I) on the surface by reacting the acid halide with the hydrogenated surface through exposure to the acid halide, and (3) etching step of etching a single atomic layer by inducing chemical reactions on the surface of the acid halide-adsorbed silicon oxide film or silicon nitride film through irradiation with a plasma containing a noble gas (at least any one of He, Ar, Ne, Kr, and Xe).

7 Claims, 5 Drawing Sheets

(56) References Cited

U.S. PATENT DOCUMENTS

| | | |
|---|---|---|
| 2016/0196984 A1 | 7/2016 | Lill et al. |
| 2016/0211147 A1 | 7/2016 | Fukazawa |
| 2017/0256416 A1 | 9/2017 | Fischer et al. |
| 2018/0182597 A1 | 6/2018 | Blomberg et al. |

FOREIGN PATENT DOCUMENTS

| | | |
|---|---|---|
| JP | 2013235912 A | 11/2013 |
| JP | 2016129227 A | 7/2016 |
| JP | 2016134623 A | 7/2016 |
| JP | 2017157836 A | 9/2017 |

OTHER PUBLICATIONS

Holland et al., Thermal and photochemical promotion of silicon and silicon dioxide etching by carbonyl difluoride, Journal of applied physics, 60(7):2553-2558 (1986).

International Search Report issued in corresponding International application No. PCT/JP2018/034213.

D.M.L. Bruce, et al., "Fluorocarbon assisted atomic layer etching of SiO2 using cyclic Ar/C4F8 plasma", Journal of Vacuum Science & Technology A: Vacuum, Surfaces, and Films, vol. 32, pp. 1-5 (Mar.-Apr. 2014).

J.W. DuMont, et al., "Thermal Atomic Layer Etching of SiO2 by a "Conversion-Etch" Mechanism Using Sequential Reactions of Trimethylaluminum and Hydrogen Fluoride", ACS Applied Materials & Interfaces 2017, vol. 9 (No. 11), pp. 10296-10307, (Feb. 2017).

ATOMIC LAYER ETCHING USING ACID HALIDE

TECHNICAL FIELD

The present invention relates to atomic layer etching (ALE) for etching the thickness of a single atomic layer by: hydrogenating a surface of an etching target; causing chemisorption of an acid halide represented by Rf—COX (Rf is H, F, a substituent consisting of C and F, a substituent consisting of C, H, and F, or —COX; each X is independently any halogen atom of F, Cl, Br, and I) on the hydrogenated etching target through exposure to the acid halide; and etching the surface of the acid halide-adsorbed etching target through irradiation with a plasma containing a noble gas.

BACKGROUND ART

Leading-edge semiconductor devices are undergoing further high integration still today through microfabrication and adoption of three-dimensional structures, for example.

In logic devices, miniaturization has progressed to the extent that a gate length and a half-pitch of flash memory reach a single-digit nm level. Accordingly, extremely high accuracy is required in each step of etching, film forming, and the like, and conventional etching techniques and film forming techniques have already faced difficulties in handling such a requirement.

Concerning the above-mentioned problem, attention has been drawn to the techniques of processing at a single atomic layer level, such as atomic layer etching (ALE) and atomic layer deposition (ALD).

In ALD, an intended film is formed by depositing a single molecular layer at one time typically through a method including causing adsorption of a precursor, such as a volatile organometallic compound, on a substrate, subsequently introducing another precursor that reacts with the adsorbed precursor on the surface, and repeating such adsorption and surface reactions. In the case of ALD of $Al_2O_3$, for example, film formation progresses through repeated reactions: by alternately introducing trimethylaluminum ($AlMe_3$) and water ($H_2O$), Al-Me bonds react with $H_2O$ to form Al—OH bonds while releasing methane; and Al—OH reacts with newly introduced $AlMe_3$ to form Al—O—Al bonds.

In most cases of ALE, a modified layer is first formed on the outermost surface of a substrate to be etched by supplying an etching species having a halogen atom and/or an organic substituent to the substrate and by reacting the etching species with the substrate through a plasma and/or heat treatment. Subsequently, only the outermost surface portion where the modified layer has been formed is removed by applying energy to the substrate to be etched, whose outermost surface has been modified, through heat or through an ion beam or a plasma of an inert gas, such as Ar, to induce chemical reactions of the modified layer and to form a volatile substance. By repeating these reactions, it is possible to perform etching while controlling the thickness of the modified layer. Further, by adjusting the thickness of the modified layer, for example, with the amount of an etching species supplied, it is also possible to perform etching at a single atomic layer level.

Compared with ALD, adjusting the thickness of the modified layer to the thickness of a single atomic layer is difficult in ALE. When etching progresses more than necessary or when the thickness of the modified layer is uneven, there is a problem in which etching with high in-plane uniformity becomes difficult. Accordingly, it is generally difficult to etch with good controllability of the thickness at a single atomic layer level.

Patent Literature (PTL) 1 discloses a method for ALE of a polycrystalline silicon layer by $Cl_2$. First, a substrate on which a polycrystalline silicon layer has been formed is exposed to $Cl_2$ to form bonds between Cl and Si. Subsequently, surface atoms of the polycrystalline silicon layer that have been bonded with Cl are desorbed from the substrate by treating with Ar plasma. ALE is performed by repeating the above procedure. In the method described in PTL 1, the thickness of Si etched in one cycle is 0.45 nm/cycle. Since the atomic radius of Si is 0.111 nm, about two Si atoms are calculated to be removed from the substrate surface in one cycle. Moreover, even when the exposure time to $Cl_2$ and/or the irradiation time with Ar plasma are extended, the thickness of Si etched does not vary significantly from 0.45 nm/cycle. Accordingly, it is revealed that adsorption of $Cl_2$ on Si surface does not progress further after reaching a steady state, and etching does not progress further when Cl-adsorbed Si is removed to consume Cl on the surface through irradiation with Ar plasma. Hence, etching with good controllability is possible in polycrystalline silicon.

PTL 2 discloses a method for ALE of $SiO_2$ by using $C_2F_6$ or $C_4F_8$. As the etching method, first, C and F components are adsorbed on the surface of a $SiO_2$ sample by allowing an inert gas, such as Ar or $N_2$, as a carrier gas to flow into a vacuum apparatus in which the $SiO_2$ sample has been placed and by supplying $C_2F_6$ or $C_4F_8$ into the vacuum apparatus for 0.3 second. Subsequently, the C and F component-adsorbed $SiO_2$ sample surface is etched by purging $C_2F_6$ or $C_4F_8$ and then applying RF power for 1 second to form the carrier gas into a plasma. ALE is performed by repeating the above procedure. In the method described in PTL 2, however, the thickness etched in one cycle is 0.005 to 0.05 nm/cycle. Taking into account the fact that the actual thickness of a single atomic layer of $SiO_2$ is about 0.18 nm, etching with good controllability of a single atomic layer is considered to be unsuccessful. Moreover, there is a risk of making precise control difficult depending on an apparatus used due to the extremely short duration of gas supply and/or RF power application.

ALE described in Non-Patent Literature (NPL) 1 employs a type of plasma etching apparatus that can control energy of ions incident on a substrate through voltage application to ions in a plasma. First, a fluorocarbon film is deposited on $SiO_2$ by generating Ar plasma in a vacuum chamber in which a $SiO_2$ sample has been placed, and introducing $C_4F_8$ into the vacuum chamber for a short time. Subsequently, introduction of $C_4F_8$ is terminated, and voltage is applied to the plasma to promote reactions between the fluorocarbon film and $SiO_2$ by $Ar^+$ ions, thereby removing $SiO_2$ on the surface. ALE is performed by repeating the above procedure. In the method described in NPL 1, the thickness of $SiO_2$ etched in one cycle is 0.2 to 0.4 nm/cycle, and hence etching of 1 to 2 atomic layers of $SiO_2$ is successful.

As the number of etching cycles increases, however, the thickness of $SiO_2$ etched in one cycle tends to increase. This is presumably because a fluorocarbon film is also deposited on the inner wall of the vacuum chamber by $C_4F_8$ plasma, and due to a minute amount of fluorocarbon components supplied therefrom, the thickness of a fluorocarbon film deposited on $SiO_2$ increases. In addition, deposition of a fluorocarbon film on the chamber wall, through accumulation, involves a risk of contamination of a wafer as particles.

Although the number of cycles needs to be increased in ALE when the etched amount is large, such a measure is considered to be difficult to adopt in the method of NPL 1.

ALE described in NPL 2 is performed in the following method. First, a $SiO_2$ substrate at 300° C. is exposed to trimethylaluminum (TMA) to induce reactions between $SiO_2$ and TMA while desorbing $Si(CH_3)_x$ and forming aluminum oxide. The aluminum oxide layer on the surface is then converted into an aluminum fluoride layer through exposure to HF. Subsequently, upon exposure to TMA again, $AlF_x(CH_3)_{3-x}$ and $SiF_x(CH_3)_{4-x}$ are desorbed. As in the foregoing, ALE progresses by alternately exposing to TMA and HF. In the method described in NPL 2, the thickness of $SiO_2$ etched in one cycle is 0.027 to 0.31 nm/cycle, and it is a method with good controllability that enables etching of a single atomic layer of $SiO_2$ at one time. Similar to NPL 1, however, deposition of a film on the inner surface of an apparatus is a concern in this method too. Moreover, from the nature of the reaction cycle employed, Al, C, H, F, and the like eventually remain on the $SiO_2$ film surface, and hence, electrical characteristics of $SiO_2$ could possibly deteriorate.

CITATION LIST

Patent Literature

PTL 1: Japanese Unexamined Patent Application Publication No. 2013-235912
PTL 2: Japanese Unexamined Patent Application Publication No. 2016-134623

Non Patent Literature

NPL 1: Journal of Vacuum Science & Technology A: Vacuum, Surfaces, and Films 32, 020603 (2014)
NPL 2: ACS Applied Materials & Interfaces 2017, 9 (11), 10296-10307

SUMMARY OF INVENTION

Technical Problem

Preceding inventions and studies have revealed that ALE can be performed for a film of an elemental substance, such as polycrystalline silicon, and for a film composed of a plurality of elements, such as $SiO_2$. Accordingly, ALE is considered to be useful as a processing method with high selectivity and controllability that are required in the actual fabrication of leading-edge semiconductor devices.

ALE for a $SiO_2$ film as described in PTL 2, NPL 1, and NPL 2, however, tends to require more elements for etching, compared with ALE for a film of an elemental substance, such as polycrystalline silicon, as described in PTL 1. Accordingly, there are problems in which contamination, film deposition inside an apparatus, and the like tend to occur due to the effect of an element that readily forms a low-volatile compound, among elements essential for etching. In particular, when the number of process cycles in ALE (for example, repeated adsorption of a molecule and the like that contribute to etching and promotion of surface reactions through heat or ion irradiation) increases, such an effect grows, and processing accuracy and/or reproducibility could possibly deteriorate.

Moreover, according to the mechanism in PTL 2 and NPL 1, the etched amount of $SiO_2$ in one cycle of ALE depends on the amount of C and F components supplied to the $SiO_2$ surface. Accordingly, it is required to precisely control time for introducing a fluorocarbon gas, which is supplied inside a reaction vessel, and/or time for generating a plasma.

The present invention provides a method of atomic layer etching (ALE) with good reproducibility and controllability by repeating three steps of (1) hydrogenation step of hydrogenating a surface by irradiating an etching target composed of a plurality of elements, such as a silicon oxide film or a silicon nitride film, with a plasma containing H, (2) acid halide adsorption step of causing chemisorption of Rf—COX (Rf is H, F, or a substituent containing C and F or containing C, H, and F; each X is independently any halogen atom of F, Cl, Br and I; the same holds hereinafter) by reacting Rf—COX with the hydrogenated surface through exposure to Rf—COX, and (3) etching step of etching a single atomic layer by inducing chemical reactions on the surface of the acid halide-adsorbed etching target through irradiation with a plasma containing a noble gas (at least any one of He, Ar, Ne, Kr, and Xe; the same holds hereinafter).

Solution to Problem

As a result of the intensive studies for achieving the above-mentioned object, the present inventors found that a method including treating the surface of an etching target with hydrogen plasma or the like, subsequently exposing the surface to an acid halide represented by Rf—COX, and etching the surface of the acid halide-adsorbed etching target through irradiation with a plasma using a noble gas is effective for processing an etching target composed of a plurality of elements, such as $SiO_2$, by atomic layer etching that has suppressed contamination of an apparatus and/or an etching target, good reproducibility, and controllability. ALE using an acid halide has not been reported in the past, and it was totally unpredictable that precise etching is possible by using an acid halide.

According to the present invention, the following embodiments are provided.

[1]
A method of atomic layer etching using an acid halide represented by the following general formula:

Rf—COX where: Rf is H, F, a substituent consisting of C and F, a substituent consisting of C, H, and F, or —COX; and each X is independently any halogen atom of F, Cl, Br, and I.

[2]
A method of atomic layer etching including steps of:
(1) hydrogenating a surface of an etching target;
(2) causing adsorption of an acid halide on the surface of the etching target by exposing the resulting hydrogenated surface to the acid halide, the acid halide being represented by the following general formula:

Rf—COX where: Rf is H, F, a substituent consisting of C and F, a substituent consisting of C, H, and F, or —COX; and each X is independently any halogen atom of F, Cl, Br, and I; and
(3) etching the resulting acid halide-adsorbed surface by irradiating the acid halide-adsorbed surface with a plasma containing a noble gas.

[3]
The method of atomic layer etching according to [2], where the etching target is any of $SiO_2$, SiN, SiON, SiCN, SiOCN, and SiOC.

[4]
The method of atomic layer etching according to [2] or [3], where the step (1) includes forming a gas containing hydrogen atoms into a plasma and hydrogenating the surface of the etching target by generated hydrogen radicals and hydrogen ions.

[5]

The method of atomic layer etching according to any one of [2] to [4], where the gas containing hydrogen atoms used in the step (1) is any of $H_2$, $CH_4$, and $SiH_4$.

[6]

The method of atomic layer etching according to any one of [2] to [5], where: Rf—COX used in the step (2) is represented by $C_aH_bF_cCOX$; $0 \leq a \leq 6$, $0 \leq b \leq 12$, $0 \leq c \leq 13$, $2a-3 \leq b+c$, and $1 \leq b+c$ are satisfied; and X is any of F, Cl, Br, and I.

[7]

The method of atomic layer etching according to any one of [2] to [5], where Rf—COX used in the step (2) is any of $COF_2$, COFH, COFCl, COFBr, COFI, $CF_3COF$, $CHF_2COF$, $CF_3COCl$, $CHF_2COCl$, $(COF)_2$, and (COF)COCl.

[8]

The method of atomic layer etching according any one of [2] to [7], where the noble gas used in the step (3) is any one of He, Ar, Ne, Kr, and Xe.

Advantageous Effects of Invention

The present invention overcomes problems of the conventional methods of atomic layer etching for an etching target composed of a plurality of elements and provides a method of atomic layer etching with better controllability and reproducibility. First, the mechanism of atomic layer etching in the present invention will be described with reference to FIG. 1, which is an exemplary case of etching $SiO_2$ by using $H_2$ as a gas containing hydrogen, $CF_3COF$ as an acid halide, and Ar as a noble gas.

First, when the $SiO_2$ surface is treated with $H_2$ plasma, Si—OH is formed near the surface through, for example, collision of $H^+$ ions with the $SiO_2$ surface or adsorption of H radicals on the $SiO_2$ surface. Upon exposure to $CF_3COF$, $CF_3COF$ and Si—OH are reacted on the outermost surface while chemisorbing $CF_3COF$ as Si—O—$COCF_3$ on the surface and releasing HF. Upon irradiation with Ar plasma, $Ar^+$ ions collide with the $SiO_2$ surface where $CF_3COF$ has been chemisorbed, thereby exciting chemical reactions in $CF_3COF$-chemisorbed portions and desorbing volatile $SiF_x$, $CO_x$, and/or $CF_x$ from the $SiO_2$ surface. Consequently, etching progresses.

The present invention that performs atomic layer etching through the above-described mechanism exerts the following advantageous effects.

(1) An acid halide is chemisorbed on the surface of an etching target by reactions between the acid halide and hydrogen atom-terminated substituents, such as hydroxyl groups and amino groups, formed on the outermost surface of the etching target through treatment with a plasma containing hydrogen. Hence, when the hydrogen-terminated substituents are consumed by the reactions, adsorption of the acid halide ceases. Accordingly, supply of elements required for etching is always stable, and consequently, fine tuning of duration of gas supply is not needed and the etched amount is easily controlled.

(2) Even when hydrogen termination is performed through plasma treatment, but when generated substituents do not react with an acid halide (for example, C—H), an acid halide is not adsorbed on the surface of such a substance. Different from an etching target on which an acid halide is adsorbed, etching of such a substance is unlikely to progress in the etching step. Accordingly, it is possible to perform atomic layer etching of an etching target with high selectivity to such a substance.

(3) The amount of an acid halide adsorbed on the inner wall of an apparatus that performs atomic layer etching, as that on an etching target, does not increase further once substituents that react with the acid halide are consumed. Hence, different from the case that uses a fluorocarbon gas as in the preceding inventions, there is no risk of deposition as a film or the resulting excessive supply of elements that contribute to etching. Moreover, surface contamination by particles due to peeling of a film per se does not occur. Accordingly, etching with good controllability and high reproducibility is possible even when the number of atomic layer etching repeated is increased.

(4) The reactions between the surface of a hydrogen-terminated etching target and an acid halide progress at normal temperature. In addition, the subsequent induction of etching reactions is performed by irradiation with a plasma of a noble gas. Accordingly, heating of an etching target is not required, and consequently, atomic layer etching is possible while suppressing thermal deformation and/or stress damages therefrom.

(5) An acid halide used in the present invention is composed of C, H, O, and X (X is any of F, Cl, Br, and I). These elements tend to form volatile compounds and are less likely to remain on a processed substrate after atomic layer etching as well. Accordingly, atomic layer etching is possible without contamination on a processed substrate or deterioration of physical properties of a substance on the substrate after etching.

(6) Atomic layer etching of the present invention is not a method in which elements that contribute to etching are supplied in a form of a deposition film as in the preceding inventions. Accordingly, even when atomic layer etching is performed for patterns, such as line & space as well as holes, there is neither film deposition on pattern sidewalls nor risk of blocking of pattern openings. Hence, atomic layer etching of the present invention is applicable even to high-aspect-ratio patterns.

DESCRIPTION OF EMBODIMENTS

[Acid Halides]

Figure 1:
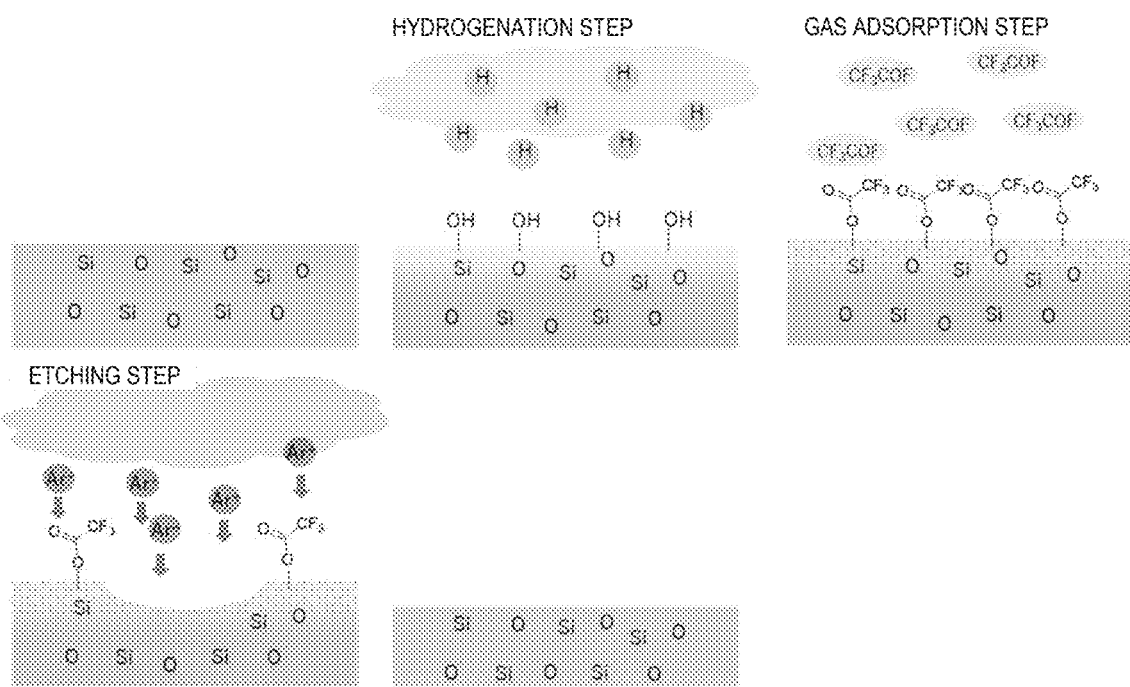
FIG. 1 is a conceptual diagram illustrating the etching mechanism in the present invention.

An acid halide represented by Rf—COX used in a method of atomic layer etching of the present invention has a purity in the gas phase portion of desirably 80 vol % or more and particularly preferably 90 vol % or more.

[Method of Atomic Layer Etching of Present Invention]

Processing steps of an etching target in a method of atomic layer etching of the present invention include three steps of: a step of hydrogenating the surface of the etching target (hereinafter, referred to as hydrogenation step); a step of causing adsorption of Rf—COX on the surface of the etching target through exposure to Rf—COX (hereinafter, referred to as acid halide adsorption step); and a step of etching the resulting Rf—COX-adsorbed etching target through irradiation with a plasma containing a noble gas (hereinafter, referred to as etching step). The order of these steps is hydrogenation step→acid halide adsorption step→etching step. Moreover, to prevent an effect of mixing of gases introduced, a period for replacing gases or achieving high vacuum state inside a processing apparatus may be set between the respective steps.

In the hydrogenation step, it is desirable to form any gas of Hz, $CH_4$, and $SiH_4$ alone or mixed gases thereof into a plasma and to treat the surface of an etching target therewith. Particularly preferably, $H_2$ is used.

A hydrogen atom and a hydrogen ion have a smaller atomic radius or ionic radius than other atoms. Hence, as in the hydrogenation step of the present invention, when an etching target is irradiated with a plasma containing hydrogen atoms, hydrogen atoms and hydrogen ions each having a large energy in the plasma penetrate into deep positions from the surface of the etching target. In such a case, although bonds, such as Si—OH and Si—NH, are originally desired to be formed on the outermost surface, such bonds are also formed at deeper positions. As a result, there is a risk of adsorption of an acid halide more than necessary in the subsequent acid halide adsorption step.

To prevent the above-described penetration of hydrogen atoms and hydrogen ions deep into an etching target, it is important not to generate hydrogen atoms and hydrogen ions having a large energy in the hydrogenation step. Accordingly, RF power for generating a plasma in the hydrogenation step is desirably 1 to 50 W and further desirably 1 to 20 W.

When an etching apparatus that has a mechanism for adjusting incident energy on an etching target of ions generated in a plasma through a bias power applied to a lower electrode of the etching apparatus, the bias power is desirably set to 0 to 100 W and more desirably 0 to 50 W.

Further, to prevent generation of hydrogen atoms and hydrogen ions having a large energy in the hydrogenation step, the pressure condition in the hydrogenation step is desirably 1 to 50 Pa and more desirably 10 to 50 Pa.

In the acid halide adsorption step, the pressure of Rf—COX introduced into a processing apparatus is desirably set to 0.1 to 100 Pa and particularly preferably 1 to 60 Pa.

The structure of an acid halide introduced into a processing apparatus in the acid halide adsorption step is represented by the following general formula:

Rf—COX where: Rf is H, F, a substituent consisting of C and F, a substituent consisting of C, H, and F, or —COX; and each X is independently any halogen atom of F, Cl, Br, and I. The substituent consisting of C and F and the substituent consisting of C, H, and F may be any substituent composed of these atoms, and the examples include $CF_3$— and $CHF_2$—. It is desirable that the structure of Rf—COX is represented by $C_aH_bF_c$COX; $0 \leq a \leq 6$, $0 \leq b \leq 12$, $0 \leq c \leq 13$, $2a-3 \leq b+c$, and $1 \leq b+c$ are satisfied; and X is any of F, Cl, Br, and I. Suitable examples of the acid halide include $COF_2$, COFH, COFCl, COFBr, COFI, $CF_3$COF, $CHF_2$COF, $CF_3$COCl, $CHF_2$COCl, $(COF)_2$, (COF)COCl, and mixed gases of two or more of these compounds.

In the etching step, it is desirable to form any noble gas of He, Ar, Ne, Kr, and Xe alone or mixed gases thereof into a plasma and to treat the surface of an etching target therewith. Particularly desirably, Ar is used.

In the etching step, when the energy of noble gas ions for irradiating the acid halide-adsorbed etching target is larger than the binding energy of the etching target (Si—O, Si—N), not only are etching reactions on the acid halide-adsorbed surface promoted, but also physical sputtering progresses. Accordingly, it is desirable to irradiate with a weaker energy than the binding energy of the etching target. In the etching step of the present invention, RF power is desirably 5 to 100 W and more desirably 5 to 60 W.

EXAMPLES

Hereinafter, the present invention will be described in further detail with the Examples and the Comparative Examples. The present invention, however, is not limited to these examples.

Figure 2:
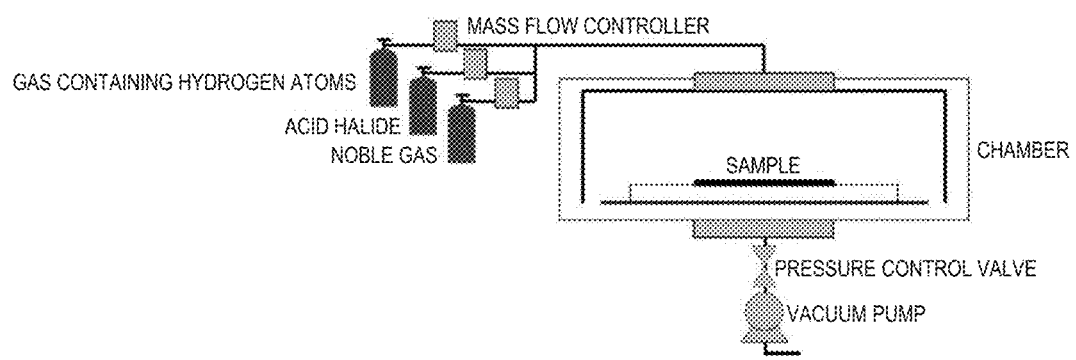
FIG. 2 is a schematic view of a plasma etching apparatus used in the working examples of the present invention.

The examples below were performed by using the plasma etching apparatus illustrated in FIG. 2. The apparatus includes: a chamber for generating a plasma at a low pressure; a temperature control mechanism for controlling the temperature of a sample to be processed; and a mass flow controller for introducing each of a gas containing hydrogen atoms used in the hydrogenation step, an acid halide for exposure in the acid halide adsorption step, and a noble gas used in the etching step, as well as for adjusting the flow rates during introduction of these gases. The apparatus is designed to introduce these gases from the upper portion of the chamber. In the lower portion of the vacuum chamber, a pressure control mechanism for controlling the pressure inside the chamber is arranged, as well as a vacuum pump for achieving high vacuum in the downstream side of the pressure control mechanism. The apparatus of FIG. 2 is a capacitively coupled plasma etching apparatus that generates a plasma by applying RF power between upper and lower electrode pair inside the vacuum chamber. Alternatively, an inductively coupled plasma etching apparatus and a type of plasma etching apparatus that utilizes electron cyclotron resonance, for example, may also be used.

TABLE 1

| (1) Hydrogenation step | |
|---|---|
| Flow rate of gas containing hydrogen atoms | 40 sccm |
| Pressure | 20 Pa |
| RF power | 10 W |
| Process time | 30 or 0 sec. |

TABLE 1-continued

| (2) Gas discharge · Vacuum pumping (1 × 10⁻³ Pa or lower) 30 sec. |
| --- |
| (3) Acid halide adsorption step |

| Flow rate of Rf-COF | 30 sccm |
| --- | --- |
| Pressure | 40 Pa |
| RF power | 0 |
| Process time | 30 or 0 sec. |

| (4) Gas discharge · Vacuum pumping (1 × 10⁻³ Pa or lower) 30 sec. |
| --- |
| (5) Etching step |

| Flow rate of noble gas | 50 sccm |
| --- | --- |
| Pressure | 10 Pa |
| RF power | 60 or 30W |
| Process time | 10 sec. |
| (6) Gas discharge · Vacuum pumping (1 × 10⁻³ Pa or lower) 30 sec. | |

Example 1

In accordance with the conditions of Table 1, a $SiO_2$ sample ($SiO_2$: 1,000 nm on Si substrate) and polysilicon (Poly-Si) samples (Poly-Si: 300 nm on $SiO_2$ substrate; 100 nm on Si substrate) were subjected to 30 cycles of etching while using $H_2$ as a gas containing hydrogen atoms in the hydrogenation step, $CF_3COF$ as an acid halide in the acid halide adsorption step, and using Ar as a noble gas and setting RF power to 60 W in the etching step. One cycle progresses in the order of (1)→(2)→(3)→(4)→(5)→(6) of Table 1, and processing is started from (1) again in the next cycle. As a result, the etched amount of $SiO_2$ was 9.3 nm (0.31 nm/cycle) and the etched amount of Poly-Si was 0.0 nm (0.0 nm/cycle).

Next, when the same samples were subjected to 60 cycles of etching under the same conditions, the etched amount of $SiO_2$ was 14.6 nm (0.24 nm/cycle) and the etched amount of Poly-Si was 0.0 nm (0.0 nm/cycle).

Further, after 90 cycles of etching, the etched amount of $SiO_2$ was 19.9 nm (0.22 nm/cycle) and the etched amount of Poly-Si was 0.0 nm (0.0 nm/cycle).

Figure 3:
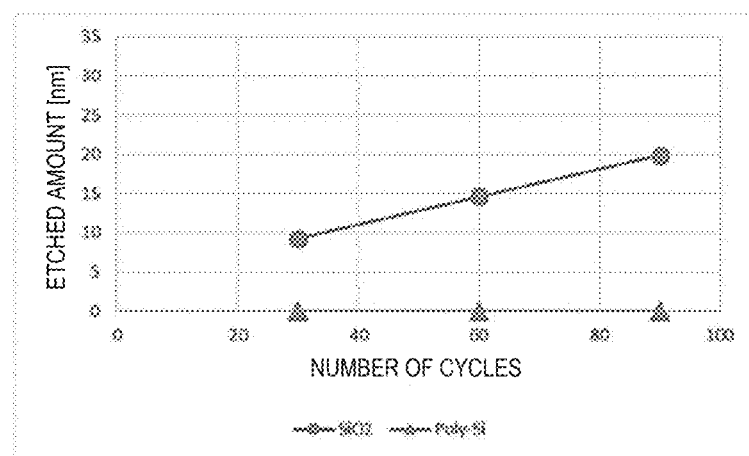
FIG. 3 is a chart plotting the etched amount of $SiO_2$ and Poly-Si against the number of etching cycles in Example 1.

The above results are summarized in FIG. 3.

Example 2

In accordance with the conditions of Table 1, a $SiO_2$ sample ($SiO_2$: 1,000 nm on Si substrate) and Poly-Si samples (Poly-Si: 300 nm on $SiO_2$ substrate; 100 nm on Si substrate) were subjected to 30 cycles of etching while using $H_2$ as a gas containing hydrogen atoms in the hydrogenation step, $CHF_2COF$ as an acid halide in the acid halide adsorption step, and using Ar as a noble gas and setting RF power to 60 W in the etching step. As a result, the etched amount of $SiO_2$ was 11.5 nm (0.38 nm/cycle) and the etched amount of Poly-Si was 0.2 nm (0.007 nm/cycle).

Next, when the same samples were subjected to 60 cycles of etching under the same conditions, the etched amount of $SiO_2$ was 19.1 nm (0.32 nm/cycle) and the etched amount of Poly-Si was 0.1 nm (0.002 nm/cycle).

Further, after 90 cycles of etching, the etched amount of $SiO_2$ was 31.4 nm (0.35 nm/cycle) and the etched amount of Poly-Si was 0.4 nm (0.004 nm/cycle).

Figure 4:
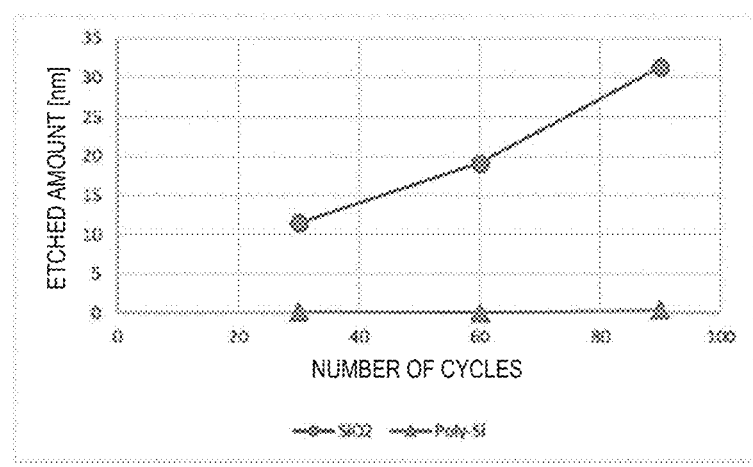
FIG. 4 is a chart plotting the etched amount of $SiO_2$ and Poly-Si against the number of etching cycles in Example 2.

The above results are summarized in FIG. 4.

Example 3

In accordance with the conditions of Table 1, a $SiO_2$ sample ($SiO_2$: 1,000 nm on Si substrate) and Poly-Si samples (Poly-Si: 300 nm on $SiO_2$ substrate; 100 nm on Si substrate) were subjected to 30 cycles of etching while using $H_2$ as a gas containing hydrogen atoms in the hydrogenation step, $CF_3COF$ as an acid halide in the acid halide adsorption step, and using Ar as a noble gas and setting RF power to 30 W in the etching step. As a result, the etched amount of $SiO_2$ was 8.4 nm (0.28 nm/cycle) and the etched amount of Poly-Si was 0.0 nm (0 nm/cycle).

Next, when the same samples were subjected to 60 cycles of etching under the same conditions, the etched amount of $SiO_2$ was 14.6 nm (0.24 nm/cycle) and the etched amount of Poly-Si was 0.0 nm (0 nm/cycle).

Further, after 90 cycles of etching, the etched amount of $SiO_2$ was 22.6 nm (0.25 nm/cycle) and the etched amount of Poly-Si was 0.1 nm (0.001 nm/cycle).

Figure 5:
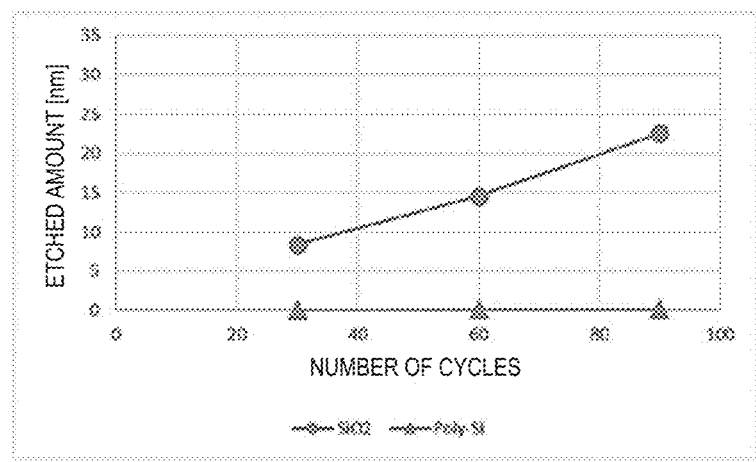
FIG. 5 is a chart plotting the etched amount of $SiO_2$ and Poly-Si against the number of etching cycles in Example 3.

The above results are summarized in FIG. 5.

Example 4

In accordance with the conditions of Table 1, a $SiO_2$ sample ($SiO_2$: 1,000 nm on Si substrate) and Poly-Si samples (Poly-Si: 300 nm on $SiO_2$ substrate; 100 nm on Si substrate) were subjected to 30 cycles of etching while using $H_2$ as a gas containing hydrogen atoms in the hydrogenation step, $CHF_2COF$ as an acid halide in the acid halide adsorption step, and using Ar as a noble gas and setting RF power to 30 W in the etching step. As a result, the etched amount of $SiO_2$ was 10.6 nm (0.35 nm/cycle) and the etched amount of Poly-Si was 0.1 nm (0.003 nm/cycle).

Next, when the same samples were subjected to 60 cycles of etching under the same conditions, the etched amount of $SiO_2$ was 14.6 nm (0.24 nm/cycle) and the etched amount of Poly-Si was 0.2 nm (0.003 nm/cycle).

Further, after 90 cycles of etching, the etched amount of $SiO_2$ was 19.2 nm (0.21 nm/cycle) and the etched amount of Poly-Si was 0.1 nm (0.001 nm/cycle).

Figure 6:
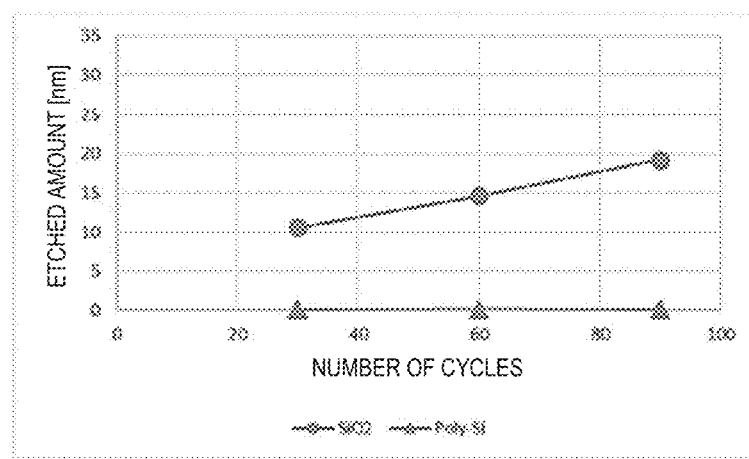
FIG. 6 is a chart plotting the etched amount of $SiO_2$ and Poly-Si against the number of etching cycles in Example 4.

The above results are summarized in FIG. 6.

Comparative Example 1

In accordance with the conditions of Table 1, a $SiO_2$ sample ($SiO_2$: 1,000 nm on Si substrate) and Poly-Si samples (Poly-Si: 300 nm on $SiO_2$ substrate; 100 nm on Si substrate) were subjected to 30 cycles of etching while using $H_2$ as a gas containing hydrogen atoms in the hydrogenation step, $C_2F_6$ in place of an acid halide in the acid halide adsorption step, and using Ar as a noble gas and setting RF power to 60 W in the etching step. As a result, the etched amount of $SiO_2$ was 0.3 am (0.01 nm/cycle) and the etched amount of Poly-Si was 0.0 nm (0.0 nm/cycle).

Next, when the same samples were subjected to 60 cycles of etching under the same conditions, the etched amount of $SiO_2$ was 3.0 nm (0.05 nm/cycle) and the etched amount of Poly-Si was 0.1 nm (0.002 nm/cycle). Further, after 90 cycles of etching, the etched amount of $SiO_2$ was 6.9 nm (0.08 nm/cycle) and the etched amount of Poly-Si was 0.6 nm (0.007 nm/cycle).

Figure 7:
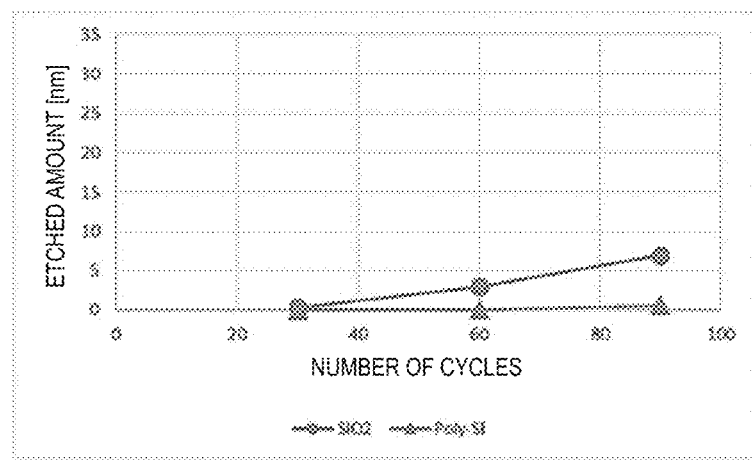
FIG. 7 is a chart plotting the etched amount of $SiO_2$ and Poly-Si against the number of etching cycles in Comparative Example 1.

The above results are summarized in FIG. 7.

Comparative Example 2

In accordance with the conditions of Table 1, a $SiO_2$ sample ($SiO_2$: 1,000 nm on Si substrate) and Poly-Si samples (Poly-Si: 300 nm on $SiO_2$ substrate; 100 nm on Si substrate) were subjected to 30 cycles of etching while using $H_2$ as a gas containing hydrogen atoms in the hydrogenation step, Ar in place of an acid halide in the acid halide adsorption step, and using Ar as a noble gas and setting RF power to 60 W in the etching step. As a result, the etched amount of $SiO_2$ was 3.4 nm (0.11 nm/cycle) and the etched amount of Poly-Si was 0.4 nm (0.01 nm/cycle).

Next, when the same samples were subjected to 60 cycles of etching under the same conditions, the etched amount of $SiO_2$ was 5.6 am (0.09 nm/cycle) and the etched amount of Poly-Si was 0.3 nm (0.005 nm/cycle).

Further, after 90 cycles of etching, the etched amount of $SiO_2$ was 5.3 nm (0.058 nm/cycle) and the etched amount of Poly-Si was 0.3 nm (0.003 nm/cycle).

Figure 8:
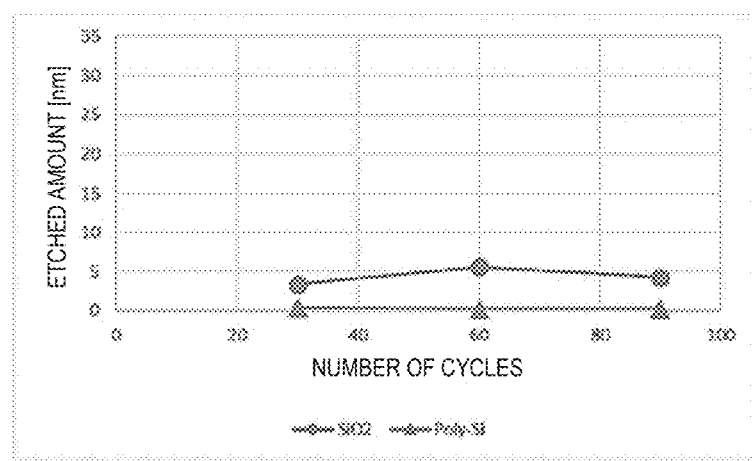
FIG. 8 is a chart plotting the etched amount of $SiO_2$ and Poly-Si against the number of etching cycles in Comparative Example 2.

The above results are summarized in FIG. 8.

Comparative Example 3

In accordance with the conditions of Table 1, a $SiO_2$ sample ($SiO_2$: 1,000 am on Si substrate) and Poly-Si samples (Poly-Si: 300 am on $SiO_2$ substrate; 100 am on Si substrate) were subjected to 30 cycles of etching while using $H_2$ as a gas containing hydrogen atoms in the hydrogenation step, Ar in place of an acid halide in the acid halide adsorption step, and using Ar as a noble gas and setting RF power to 30 W in the etching step. As a result, the etched amount of $SiO_2$ was 1.6 nm (0.053 nm/cycle) and the etched amount of Poly-Si was 0.1 nm (0.003 nm/cycle).

Next, when the same samples were subjected to 60 cycles of etching under the same conditions, the etched amount of $SiO_2$ was 2.9 nm (0.048 nm/cycle) and the etched amount of Poly-Si was 0.0 nm (0 nm/cycle).

Further, after 90 cycles of etching, the etched amount of $SiO_2$ was 4.3 nm (0.048 nm/cycle) and the etched amount of Poly-Si was 0.2 nm (0.002 nm/cycle).

Figure 9:
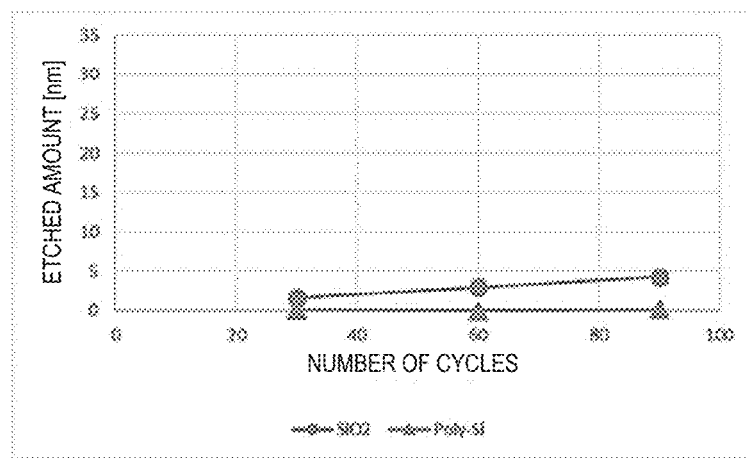
FIG. 9 is a chart plotting the etched amount of $SiO_2$ and Poly-Si against the number of etching cycles in Comparative Example 3.

The above results are summarized in FIG. 9.

Comparative Example 4

In accordance with the conditions of Table 1, a $SiO_2$ sample ($SiO_2$: 1,000 nm on Si substrate) and Poly-Si samples (Poly-Si: 300 nm on $SiO_2$ substrate; 100 nm on Si substrate) were subjected to 30 cycles of etching while setting the process time in the hydrogenation step to 0 second (without performing the hydrogenation step), using $CF_3COF$ as an acid halide in the acid halide adsorption step, and using Ar as a noble gas and setting RF power to 30 W in the etching step. As a result, the etched amount of $SiO_2$ was 0.3 nm (0.01 nm/cycle) and the etched amount of Poly-Si was 0.3 nm (0.01 nm/cycle).

Next, when the same samples were subjected to 60 cycles of etching under the same conditions, the etched amount of $SiO_2$ was 3.0 nm (0.05 nm/cycle) and the etched amount of Poly-Si was 0.3 nm (0.005 nm/cycle).

Further, after 90 cycles of etching, the etched amount of $SiO_2$ was 3.4 nm (0.038 nm/cycle) and the etched amount of Poly-Si was 0.6 nm (0.007 nm/cycle).

Figure 10:
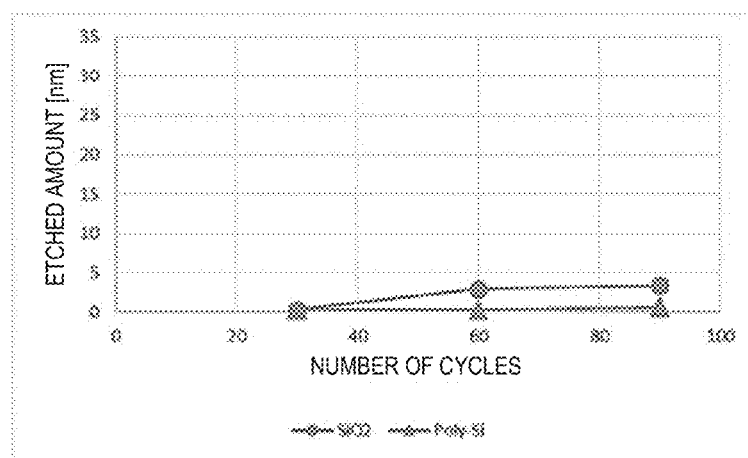
FIG. 10 is a chart plotting the etched amount of $SiO_2$ and Poly-Si against the number of etching cycles in Comparative Example 4.

The above results are summarized in FIG. 10.

The results of Examples 1 and 2 and Comparative Examples 1 and 2 reveal that in cyclic etching using Rf—COX, etching of $SiO_2$ is promoted compared with cyclic etching without using Rf—COX and the etched amount in one cycle is a value extremely close to the thickness of a single atomic layer (0.18 nm) of $SiO_2$, and hence using Rf—COX is effective in ALE of $SiO_2$. According to the present invention, the number of cycles and the total etched amount are in a proportional relationship. Hence, precise etching is found to be possible by adjusting the number of cycles. In Comparative Examples 1, 2, and 3, surface hydrogenation is performed, but the hydrogenated surface does not interact with $C_2F_6$ and/or Ar upon exposure thereto. Since elements required for etching, such as C and F, are absent on the surface in these examples, physical sputtering alone progresses in the etching step. For this reason, the etched amount in one cycle is smaller than an atomic layer of $SiO_2$ in these examples. In Comparative Example 4, since the hydrogenation step is not performed, $CF_3COF$ is not adsorbed on the surface in the acid halide adsorption step and physical sputtering alone progresses in the etching step. Hence, the etched amount in one cycle is smaller than an atomic layer of $SiO_2$.

The invention claimed is:

1. A method of atomic layer etching comprising steps of:
(1) hydrogenating a surface of an etching target;
(2) causing adsorption of an acid halide on the surface of the etching target by exposing the resulting hydrogenated surface to the acid halide, the acid halide being represented by the following general formula:

Rf—COX wherein: Rf is H, F, a substituent consisting of C and F, a substituent consisting of C, H, and F, or —COX; and each X is independently any halogen atom of F, Cl, Br, and I; and
(3) etching the resulting acid halide-adsorbed surface by irradiating the acid halide-adsorbed surface with a plasma containing a noble gas.

2. The method of atomic layer etching according to claim 1, wherein the etching target is any of $SiO_2$, SiN, SiON, SiCN, SiOCN, and SiOC.

3. The method of atomic layer etching according to claim 1, wherein the step (1) includes forming a gas containing hydrogen atoms into a plasma and hydrogenating the surface of the etching target by generated hydrogen radicals and hydrogen ions.

4. The method of atomic layer etching according to claim 1, wherein the gas containing hydrogen atoms used in the step (1) is any of $H_2$, $CH_4$, and $SiH_4$.

5. The method of atomic layer etching according to claim 1, wherein: Rf—COX used in the step (2) is represented by $C_aH_bF_cCOX$; $0 \le a \le 6$, $0 \le b \le 12$, $0 \le c \le 13$, $2a-3 \le b+c$, and $1 \le b+c$ are satisfied; and X is any of F, Cl, Br, and I.

6. The method of atomic layer etching according to claim 1, wherein Rf—COX used in the step (2) is any of $COF_2$, COFH, COFCl, COFBr, COFI, $CF_3COF$, $CHF_2COF$, $CF_3COCl$, $CHF_2COCl$, $(COF)_2$, and (COF)COCl.

7. The method of atomic layer etching according claim 1, wherein the noble gas used in the step (3) is any one of He, Ar, Ne, Kr, and Xe.

* * * * *